US007884792B2

(12) United States Patent
Oh et al.

(10) Patent No.: US 7,884,792 B2
(45) Date of Patent: Feb. 8, 2011

(54) METHOD OF EXTRACTING OPTIMIZED DIGITAL VARIABLE RESISTOR VALUE AND SYSTEM USING THE SAME

(75) Inventors: Kwan-Young Oh, Anyang-si (KR); Seung-Woo Lee, Seoul (KR); Jae-Ho Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 975 days.

(21) Appl. No.: 11/696,997

(22) Filed: Apr. 5, 2007

(65) Prior Publication Data

US 2007/0236484 A1 Oct. 11, 2007

(30) Foreign Application Priority Data

Apr. 5, 2006 (KR) ...................... 10-2006-0031090

(51) Int. Cl.
*G09G 3/36* (2006.01)
*G09G 5/00* (2006.01)
*G06F 3/038* (2006.01)
*G06F 19/00* (2006.01)
*G01R 35/00* (2006.01)
*G01R 31/00* (2006.01)
*F23Q 23/08* (2006.01)
*F23Q 23/10* (2006.01)
*H01T 21/06* (2006.01)

(52) U.S. Cl. ............................ 345/94; 345/95; 345/98; 345/207; 702/107; 324/770; 445/3

(58) Field of Classification Search ................... 345/94, 345/95, 98, 207; 324/770; 702/107; 250/552; 356/217; 445/3; 348/497
See application file for complete search history.

(56) References Cited

U.S. PATENT DOCUMENTS 5,457,474 A * 10/1995 Ikeda .......................... 345/92
6,593,921 B2 * 7/2003 Nakanishi et al. ........... 345/208
6,933,917 B2 * 8/2005 Chung et al. .................. 345/98
2005/0116910 A1 * 6/2005 Lee et al. ...................... 345/87
2006/0145986 A1 * 7/2006 Oh et al. ........................ 345/92
2007/0057975 A1 * 3/2007 Oh et al. ..................... 345/690

* cited by examiner

*Primary Examiner*—Bipin Shalwala
*Assistant Examiner*—Ilana Spar
(74) *Attorney, Agent, or Firm*—Cantor Colburn LLP

(57) ABSTRACT

A method of extracting an optimized digital variable resistor ("DVR") value of a display panel, the method including varying a DVR value, corresponding to a common voltage, and applying the varied DVR values to the display panel, measuring brightness values of the display panel for at least two frames, extracting flicker values corresponding to the varied DVR values using the brightness values, and extracting an optimized DVR value by generating first to third coordinate values in which coordinate values have x-coordinate values and y-coordinate values representing DVR values and flicker values, respectively, calculating a first linear function of a first straight line connecting two of the coordinate values, and a second linear function of a second straight line using the first linear function and the other of the coordinate values, and extracting an x-coordinate value at an intersection point of the first and second lines, as the optimized DVR value.

17 Claims, 7 Drawing Sheets

330

METHOD OF EXTRACTING OPTIMIZED DIGITAL VARIABLE RESISTOR VALUE AND SYSTEM USING THE SAME

This application claims priority to Korean Patent Application No. 2006-31090, filed on Apr. 5, 2006, and all the benefits accruing therefrom under 35 U.S.C. §119, the contents of which in its entirety are herein incorporated by reference.

BACKGROUND OF THE INVENTION

1. Field of the Invention

The present invention relates to a method of extracting an optimized digital variable resistor ("DVR") value and a system using the extracting method. More particularly, the present invention relates to a method of extracting an optimized DVR value of a display panel, capable of shortening an amount of time taken to extract the optimized DVR value and an extracting device using the extracting method.

2. Description of the Related Art

In general, a liquid crystal display ("LCD") includes a plurality of pixels, each pixel including a color filter substrate, an array substrate coupled with the color filter substrate while facing the color filter substrate, and a liquid crystal layer interposed between the color filter substrate and the array substrate. The color filter substrate is provided with color filter layers and a common electrode, and the array substrate is provided with pixel electrodes opposite to the common electrode.

A common voltage is applied to the common electrode, and a data voltage is applied to the pixel electrodes of each pixel. Therefore, an electric field is established between the pixel electrodes and the common electrode due to a potential difference between the data voltage and the common voltage. Liquid crystal molecules contained in the liquid crystal layer are aligned according to the electric field in each pixel. As a result, the LCD adjusts light transmittance of the liquid crystal layer in each pixel, thereby displaying images. Furthermore the LCD may rapidly display a series of images in order to create the illusion of a moving image. Each image in the rapidly displayed series of images is called a frame.

However, if the data voltage is continuously applied at one polarity for each frame with respect to the common voltage, the liquid crystal molecules contained in the liquid crystal layer are degraded. For this reason the polarity of the data voltage applied for each frame is changed. The data polarity is applied at both a positive and a negative polarity with respect to the common voltage.

However, when a level of the common voltage is not exactly maintained between the data voltage of a positive polarity and the data voltage of a negative polarity, a flicker phenomenon may occur on the LCD. This flicker phenomenon degrades the image quality of the LCD.

In order to reduce the flicker phenomenon, an optimized common voltage must be extracted. This optimized common voltage may differ from one LCD to another, even if produced through a common assembly process. A conventional process of extracting this optimized common voltage is complicated, increasing an inspection time for the LCD, and lowering productivity of the LCD manufacturing process.

BRIEF SUMMARY OF THE INVENTION

The present invention provides an exemplary embodiment of a method of extracting an optimized digital variable resistor ("DVR") value of a display panel, capable of shortening a time taken to extract the optimized DVR value.

The present invention also provides an exemplary embodiment of a system capable of extracting the optimized DVR value using the exemplary embodiment of a method.

In an exemplary embodiment of the present invention, an exemplary embodiment of a method of extracting an optimized digital variable resistor ("DVR") value of a display panel includes; varying a DVR value, which is obtained by digitalizing a voltage level of common voltage, three times and applying the varied DVR values to the display panel, measuring brightness values of a screen of the display panel for at least two frames, extracting flicker values corresponding to the DVR values using the brightness values, and extracting an optimized DVR value representing a minimum flicker value of the flicker values, wherein the extracting of the optimized DVR value includes; generating first, second and third coordinate values In which the first, second and third coordinate values have x-coordinate values representing the varied DVR values, and y-coordinate values representing the flicker values, calculating a first linear function corresponding to a first straight line connecting two coordinate values of the first to third coordinate values, and a second linear function corresponding to a second straight line based on the other coordinate value of the first to third coordinate values, and Extracting an x-coordinate value at an intersection point, at which the first and second straight lines intersect with each other, as the optimized DVR value using the first and second linear functions.

In another exemplary embodiment of the present invention, an exemplary embodiment of a system for extracting an optimized digital variable resistor ("DVR") value of a display panel includes a DVR which varies a digital variable resistor value three times, which is obtained by digitalizing a voltage level of common voltage, and which applies the varied DVR values to the display panel, a photometer measuring brightness values of a screen of the display panel for at least two frames, and a processor which extracts flicker values corresponding to the varied DVR values using the brightness values output from the photometer, and which extracts an optimized digital variable resistor value corresponding to a minimum flicker value, wherein the processor includes a coordinate value generator which generates first, second and third coordinate values, in which the first, second and third coordinate values have x-coordinate values representing the varied digital variable resistor values, and y-coordinate values representing flicker values, a function generator calculating a first linear function corresponding to a first straight line connecting two coordinate values of the first to third coordinate values, and a second linear function corresponding to a second straight line based on the first linear function and the other one coordinate value of the first to third coordinate values, and an optimized DVR value extractor extracting an x-coordinate value at an intersection point, at which the first and second straight lines intersect, as the optimized DVR value by using the first and second linear functions.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1A:
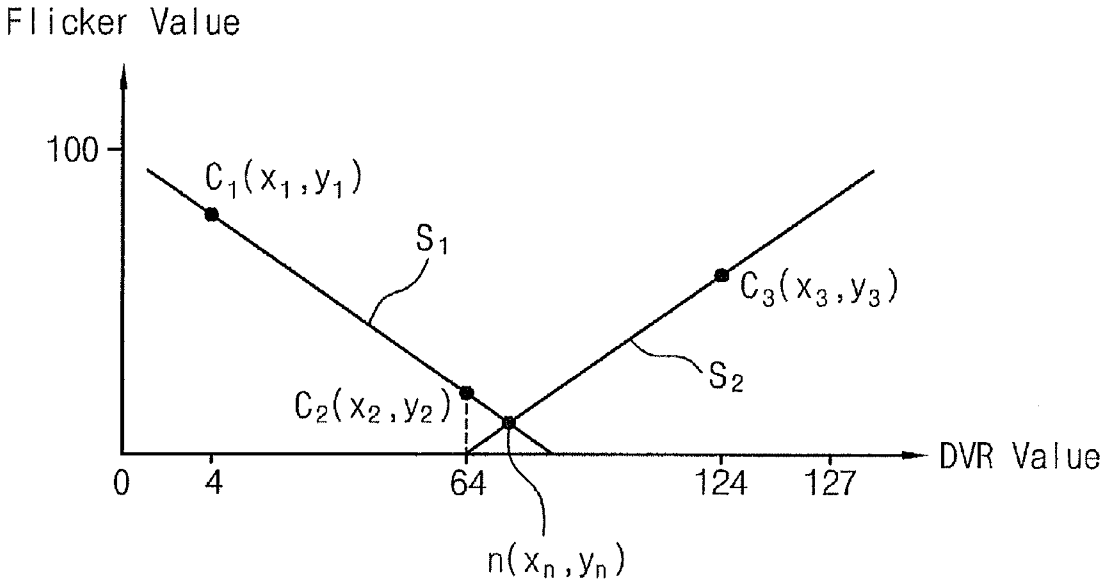
FIGS. 1A and 1B are graphs showing an exemplary embodiment of a flicker value according to a value of a digital variable resistor ("DVR") in accordance with the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be explained in detail with reference to the accompanying drawings.

Figure 1B:
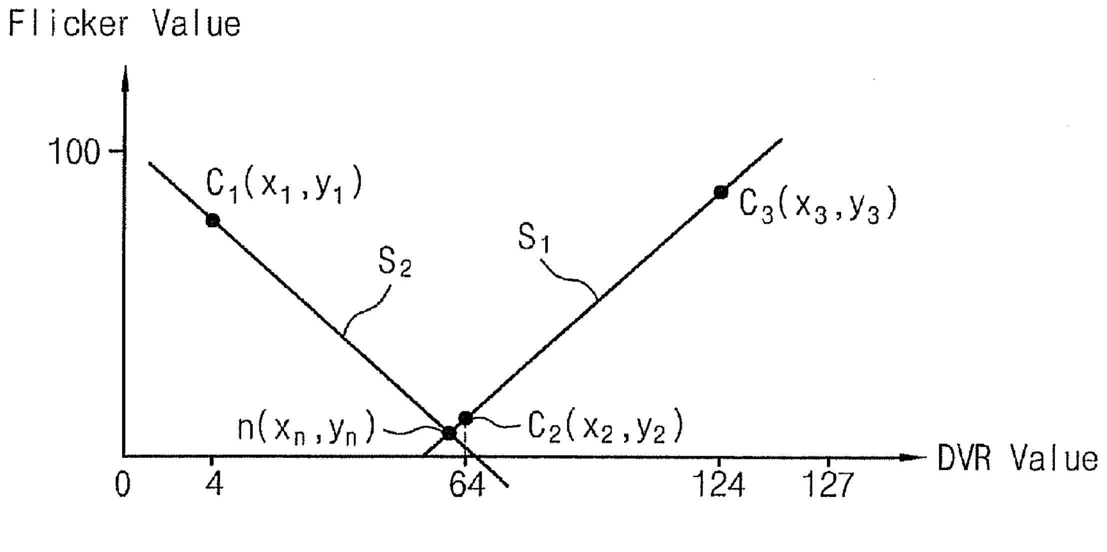
Figure 2:
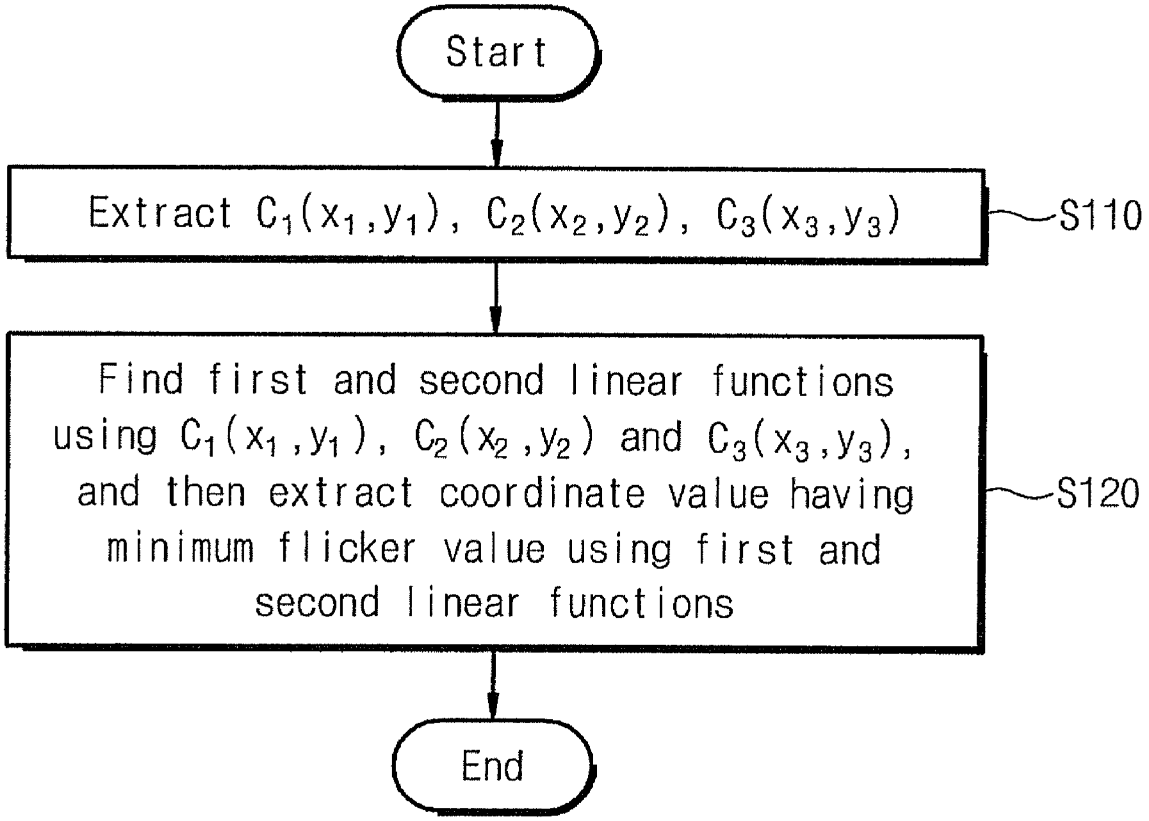
FIG. 2 is a flowchart illustrating an exemplary embodiment of a method of extracting a DVR value representing the minimum flicker value.
Figure 3:
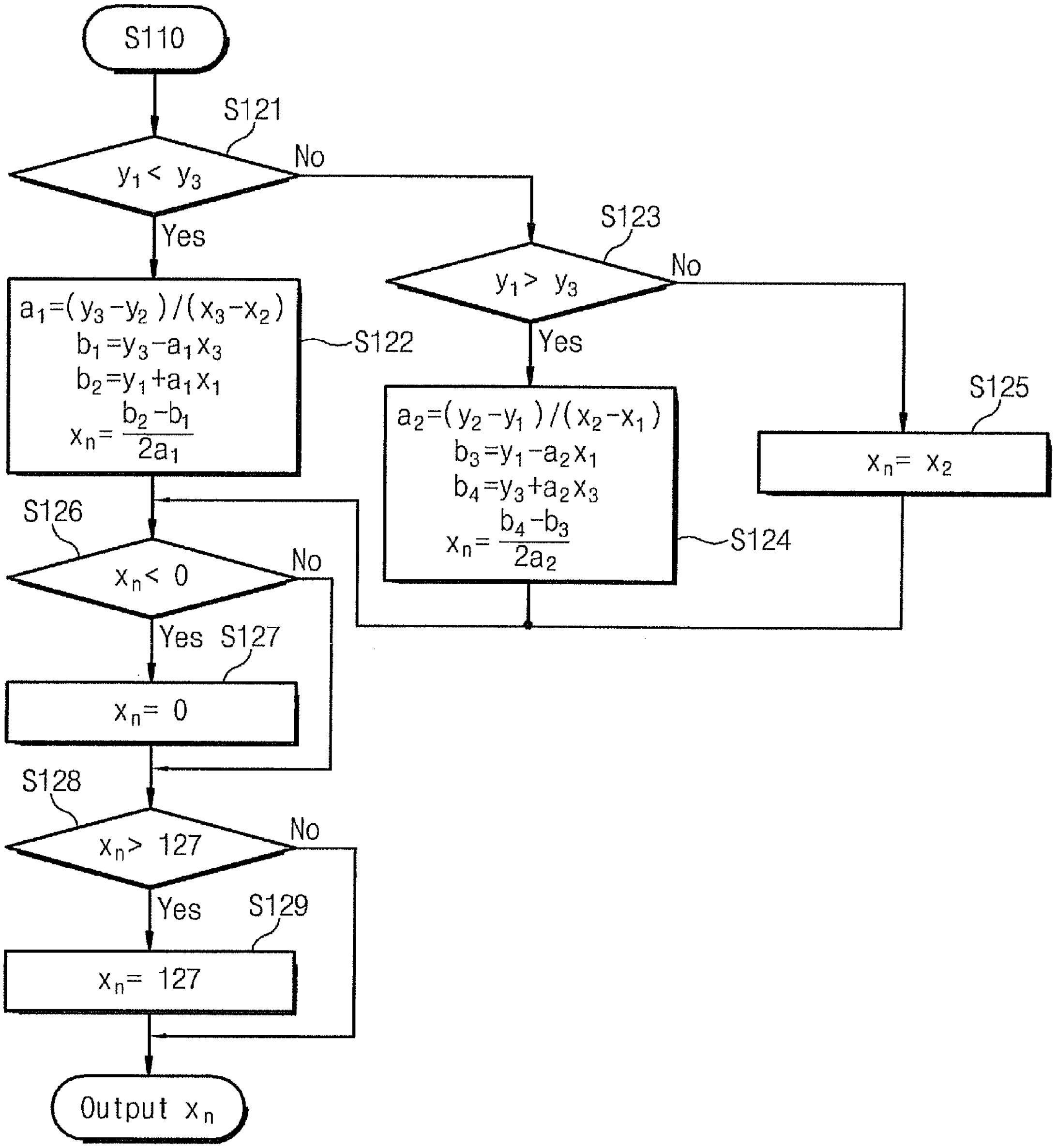
FIG. 3 is a flowchart illustrating an exemplary embodiment of step S120 of FIG. 2 in detail.

FIGS. 1A and 1B are graphs showing an exemplary embodiment of a flicker value according to a value of a digital variable resistor ("DVR") in accordance with the present invention, FIG. 2 is a flowchart illustrating an exemplary embodiment of a method of extracting a DVR value representing the minimum flicker value, and FIG. 3 is a flowchart illustrating an exemplary embodiment of step S120 of FIG. 2 in detail.

Referring to FIGS. 1A, 1B and 2, three different DVR values (e.g., values obtained by digitalizing voltage levels of a common voltage) are arbitrarily applied to a display panel displaying an image. Flicker values which correspond to the DVR values of the display panel are thereby extracted. This corresponds to step S110 of FIG. 2. The DVR values and the flicker values corresponding to the DVR values can be represented as first, second and third coordinate values $C_1$, $C_2$ and $C_3$.

In detail, the first coordinate value $C_1$ includes a first x-coordinate value $x_1$ and a first y-coordinate value $y_1$. The second coordinate value $C_2$ includes a second x-coordinate value $x_2$ and a second y-coordinate value $y_2$. The third coordinate value $C_3$ includes a third x-coordinate value $X_3$ and a third y-coordinate value $y_3$. Here, the first, second and third x-coordinate values $x_1$, $x_2$ and $X_3$ denote the DVR values, and the first, second and third y-coordinate values $y_1$, $y_2$ and $y_3$ denote the flicker values respectively corresponding to the DVR values. According to the current exemplary embodiment of the invention, the first, second and third x-coordinate values $x_1$, $x_2$ and $x_3$ are within a range of 0 to 127, and the first, second and third x-coordinate values $x_1$, $x_2$ and $x_3$ sequentially increase in magnitude. As one example, the first, second and third x-coordinate values $x_1$, $x_2$ and $X_3$ are 4, 64 and 124, respectively. The second x-coordinate value $x_2$ is a intermediate value 64 between the first x-coordinate value 4 and the third x-coordinate value 124. Alternative exemplary embodiments include configurations wherein the x-coordinate values $x_1$, $x_2$ and $x_3$ are within larger or smaller ranges.

Next, the first y-coordinate value $y_1$ is compared with the third y-coordinate value $y_3$ to obtain a first linear function and a second linear function. This step corresponds to step S120 of FIG. 2. As shown in FIG. 1A, if the first y-coordinate value $y_1$, is greater than the third y-coordinate value $y_3$, a first linear function represented by a first straight line $S_1$ which connects the first coordinate value $C_1$ and the second coordinate value $C_2$, and a second linear function represented by a second straight line $S_2$ which intersects the first straight line $S_1$ and symmetrizes the y-axis of the first straight line $S_1$ and the third coordinate value $C_3$ are determined. As shown in FIG. 1B, if the first y-coordinate value $y_1$ is smaller than the third y-coordinate value $y_3$, a first linear function represented by a first straight line $S_1$ which connects the second coordinate value $C_2$ and the third coordinate value $C_3$, and a second linear function represented by a second straight line $S_2$ which intersects first straight line $S_1$ and the first coordinate value $C_1$ is determined.

As illustrated in FIG. 3, the first y-coordinate value $y_1$ is compared with the third y-coordinate value $y_3$ in order to check whether the first y-coordinate value $y_1$ is smaller than the third y-coordinate value $y_3$. This corresponds to step S121 of FIG. 3.

If the first y-coordinate value $y_1$ is smaller than the third y-coordinate value $y_3$, the first linear function of the first straight line $S_1$ is defined as "$y_3=a_1x_3+b_1$". A first slope $a_1$ of the first linear function is extracted using the second and third coordinate values $C_2$ and $C_3$ as coordinate points on the line $S_1$, and a first constant b1 of the first linear function is defined as "$b_1=y_3-a_1x_3$. The second linear function of the straight line $S_2$ is defined as "$y_1=-a_1x_1+b_2$". The second straight line $S_2$ has a second slope $-a_1$ which is substantially opposite to the first slope $a_1$, and a second constant $b_2$ of the second linear function is defined as "$b_2=y_1+a_1x_1$". An x-coordinate value $x_n$ is extracted at an intersection point n, at which the first and second straight lines $S_1$ and $S_2$ intersect with each other, by using the first and second linear functions. This corresponds to step S122 of FIG. 3. In other words, a y-coordinate value $y_n$ of the intersection point n denotes the minimum flicker value of the display panel, and the x-coordinate value $x_n$ of the intersection point n denotes an optimized DVR value. In the present exemplary embodiment, the optimized DVR value $x_n$ is described by Equation 1 below.

$$x_n = \frac{b_2 - b_1}{2a_1} \qquad \text{Equation 1}$$

In contrast, if the first y-coordinate value $y_1$ is not smaller than the third y-coordinate value $y_3$, the first y-coordinate value $y_1$ is compared with the third y-coordinate value $y_3$ in order to check whether the first y-coordinate value $y_1$ is greater than the third y-coordinate value $y_3$. This corresponds to step S123 of FIG. 3. This step is performed to evaluate whether y1 and y3 might be of equal value.

If the first y-coordinate value $y_1$ is great than the third y-coordinate value $y_3$, the first linear function of the first straight line $S_1$ is defined as "$y_1=a_2x_1+b_3$". A third slope $a_2$ of the first linear function is extracted on using the first and second coordinate values $C_1$ and $C_2$ as coordinate points on the line $S_1$, and a third constant $b_3$ of the first linear function is defined as "$b_3=y_1-a_2x_1$. The second linear function of the second straight line $S_2$ is defined as "$y_3=-a_2x_3+b_4$". The second straight line $S_2$ has a fourth slope $-a_2$ which is substantially opposite to the third slope $a_2$, and a fourth constant b4 is defined as "$b_4=y_3+a_2x_3$". The x-coordinate value $x_n$ is extracted at the intersection point n by using the first and second linear functions, at which the first and second straight lines $S_1$ and $S_2$ intersect with each other. This corresponds to step S124 of FIG. 3. In other words, the y-coordinate value $y_n$ of the intersection point n denotes the minimum flicker value of the display panel, and the x-coordinate value $x_n$ of the intersection point n denotes the optimized DVR value. Here, the optimized DVR value $x_n$ is described by Equation 2 below.

$$x_n = \frac{b_4 - b_3}{2a_2} \qquad \text{Equation 2}$$

In contrast, if in step S123 it is determined that the first y-coordinate value $y_1$ is not greater than the third y-coordinate value $y_3$, in other words if $y_1$ and $y_3$ are equal, the minimum flicker value is equal to the second y-coordinate value $y_2$. Therefore, the optimized DVR value $x_n$ is equal to the second x-coordinate value $x_2$. This corresponds to step S125 of FIG. 3.

Subsequently, comparison is performed to check whether the optimized DVR value $x_n$ is less than 0. This corresponds to step S126 in FIG. 3. If the comparison result shows that the optimized DVR value $x_n$ is smaller than 0, the optimized DVR value $x_n$ is output as 0. This corresponds to step S127 in FIG. 3. In contrast, if the optimized DVR value $x_n$ is greater than 0, comparison is performed to check whether the optimized DVR value $x_n$ is greater than 127. This corresponds to step S128 in FIG. 3. If the comparison result shows that the optimized DVR value $x_n$ is greater than 127, the optimized DVR value $x_n$ is output as 127. This corresponds to step S129. If the optimized DVR value $x_n$ is neither smaller than 0 or larger than 127, then a value calculated by either Equation 1 or 2, or a value equal to the second x-coordinate value $x_2$ is output.

In this manner, the optimized DVR value $x_n$ representing the minimum flicker value $y_n$ on the display panel can be extracted by varying the DVR value three times.

Figure 4:
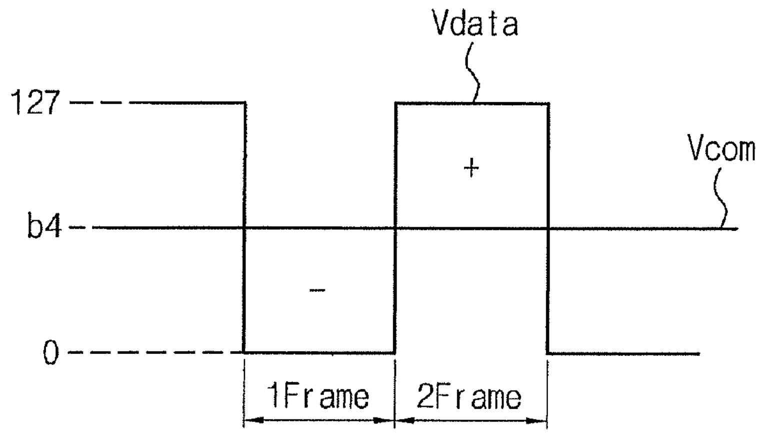
FIG. 4 is a graph illustrating exemplary waveforms of a common voltage and a data voltage.
Figure 5:
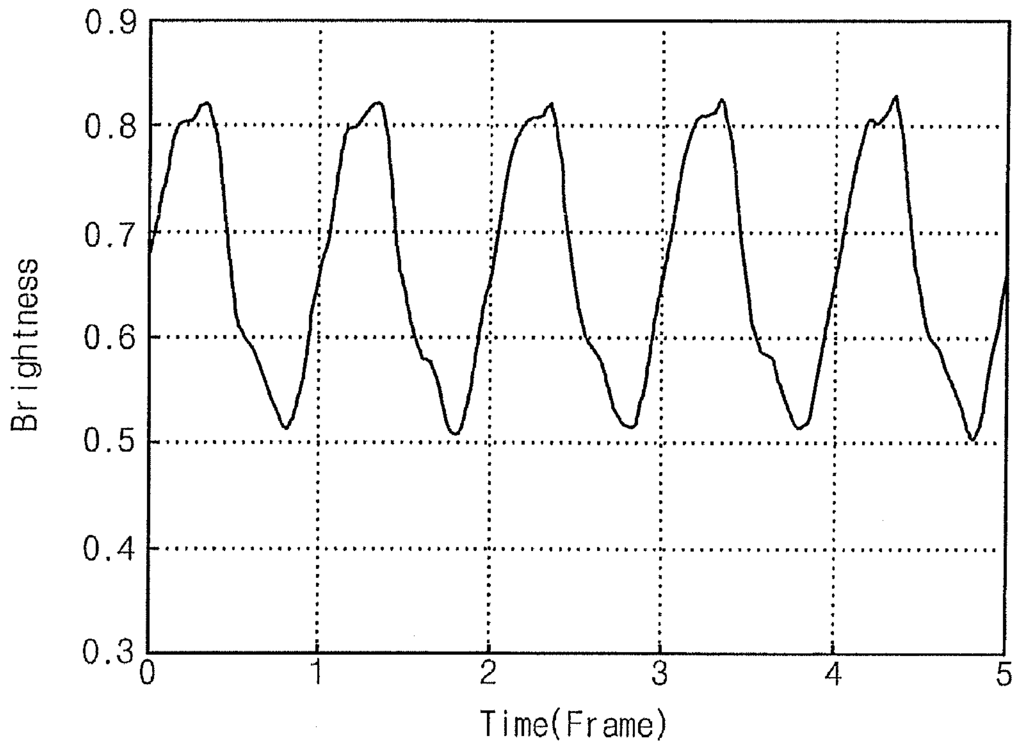
FIG. 5 is a graph showing brightness of an exemplary embodiment of a screen as a function of time.

FIG. 4 is a graph illustrating an exemplary embodiment of a waveform of common voltage and data voltage. FIG. 5 is a graph showing brightness of an exemplary embodiment of a screen as a function of time.

Referring to FIG. 4, a data voltage Vdata and a common voltage Vcom are applied to a display panel. Specifically, the data voltage Vdata is applied to a pixel electrode through a data line on the display panel, and the common voltage Vcom is applied to a common electrode, which is disposed opposite to the pixel electrode. An electric field is generated between the pixel electrode and the common electrode by a potential difference between the data voltage Vdata and the common voltage Vcom.

The display panel of a liquid crystal display ("LCD") has a liquid crystal layer interposed between the pixel electrode and the common electrode. As described above, when a data voltage Vdata having only one polarity with respect to the common voltage Vcom is continuously applied to the pixel electrode for each frame, the liquid crystals contained in the liquid crystal layer are degraded and the performance of the LCD display is similarly deteriorated.

Hence, in one exemplary embodiment of the present invention the polarity of the data voltage Vdata is inverted for each frame. When a voltage level of the common voltage Vcom is not exactly maintained between the data voltage of a positive polarity and the data voltage of a negative polarity, a flicker phenomenon takes place on a screen of the display panel. Alternative exemplary embodiments include configurations wherein the polarity of the data voltage Vdata may be inverted after two or more frames in sequence.

According to an exemplary embodiment of the present invention, the voltage level of the common voltage Vcom is sub-divided into sub-levels from $2^0$ to $2^7$, and then sequentially applied to the display panel. In one exemplary embodiment the first x-coordinate value is within a range from about 4 to about 63, the third x-coordinate value is within a range from about 65 to about 124, and the second x-coordinate value is 64. In the present exemplary embodiment the subdivision is performed on a binary basis, however alternative exemplary embodiments include other subdivisions. In this state, the brightness of the display panel is measured for at least two frames.

As illustrated in FIG. 5, an x-axis indicates a time, and a y-axis indicates brightness. The flicker values illustrated in FIG. 1 are determined by dividing alternating current ("AC") components by a direct current ("DC") component (referring to an average value of the AC components) on the brightness graph illustrated in FIG. 5.

Figure 6:
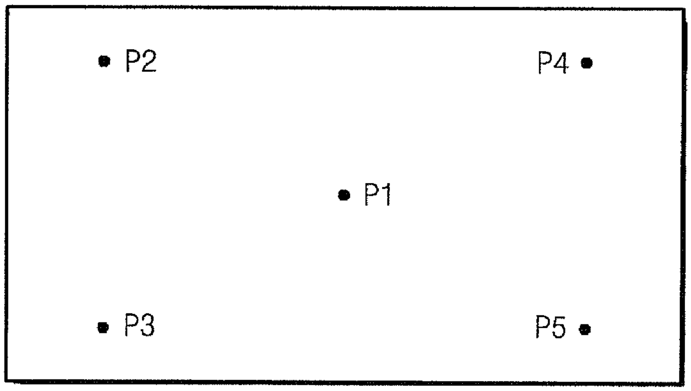
FIG. 6 is a top plan view illustrating an exemplary embodiment of an arrangement of five points on a screen of a display panel used to measure flicker values on an exemplary embodiment of a display panel.
Figure 7:
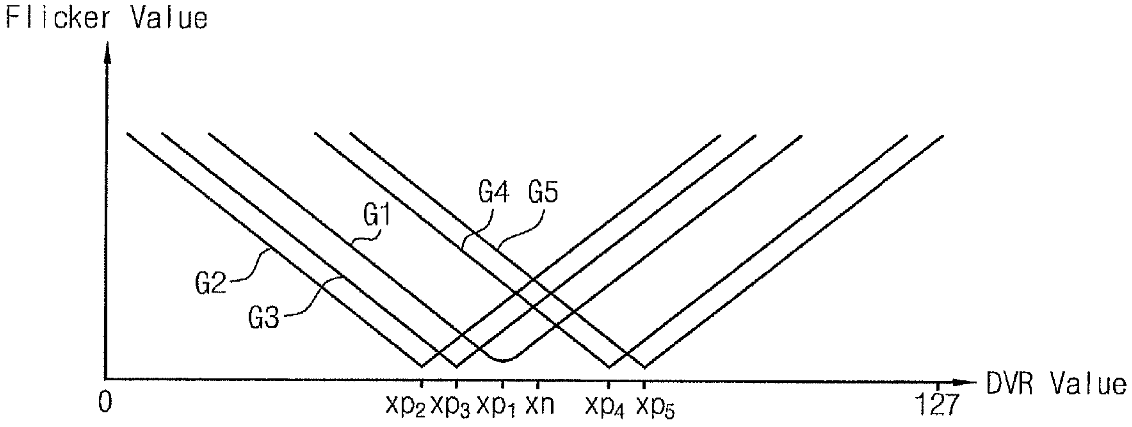
FIG. 7 is a graph illustrating a flicker value according to a DVR value at each of the points shown in FIG. 6 in the exemplary embodiment.

FIG. 6 is a top plan view illustrating an exemplary embodiment of an arrangement of five points used to measure flicker values on an exemplary embodiment of a display panel. FIG. 7 is a graph illustrating a flicker value according to a DVR value at each of the points in the exemplary embodiment shown in FIG. 5.

Referring to FIG. 6, according to another exemplary embodiment of the present invention, flicker values of first, second, third, fourth and fifth points, P1, P2, P3, P4 and P5, respectively, are measured on a screen of the display panel. According to the present exemplary embodiment the first point P1 is located at the center of the screen, the second point P2 is located at left upper portion with respect to the first point P1, the third point P3 is located at a left lower portion with respect to the first point P1, the fourth point P4 is located at a right upper portion with respect to the first point P1, and the fifth point P5 is located at a right lower portion with respect to the first point P1. Alternative exemplary embodiments include configurations wherein the positioning and the number of points may differ.

In FIG. 7, a first line G1 indicates flicker values according to DVR values at the first point P1, a second line G2 indicates flicker values according to DVR values at the second point P2, a third line G3 indicates flicker values according to DVR values at the third point P3, a fourth line G4 indicates flicker values according to DVR values at the fourth point P4, and a fifth line G5 indicates flicker values according to DVR values at the fifth point P5.

As illustrated on the first, second, third, fourth and fifth lines G1, G2, G3, G4 and G5 of FIG. 7, first, second, third, fourth and fifth DVR values $xp_1$, $Xp_2$, $Xp_3$, $Xp_4$ and $xp_5$, each of which has the minimum flicker value, are extracted at the first, second, third, fourth and fifth points P1, P2, P3, P4 and P5. Here, an optimized DVR value $x_n$ representing an optimized flicker value of the display panel has an average value of the first to fifth DVR values $xp_1$ to $xp_5$.

In another example of the present invention, because the flicker value at the first point P1 exerts the greatest influence upon the flicker values of the display panel as a whole, the optimized DVR value $x_n$ may have an average value calculated by adding a weight to the first DVR value $xp_1$. The human eye will tend to notice flicker at the center of the display, as measured at point P1, more readily than flicker at the periphery of the display.

Figure 8:
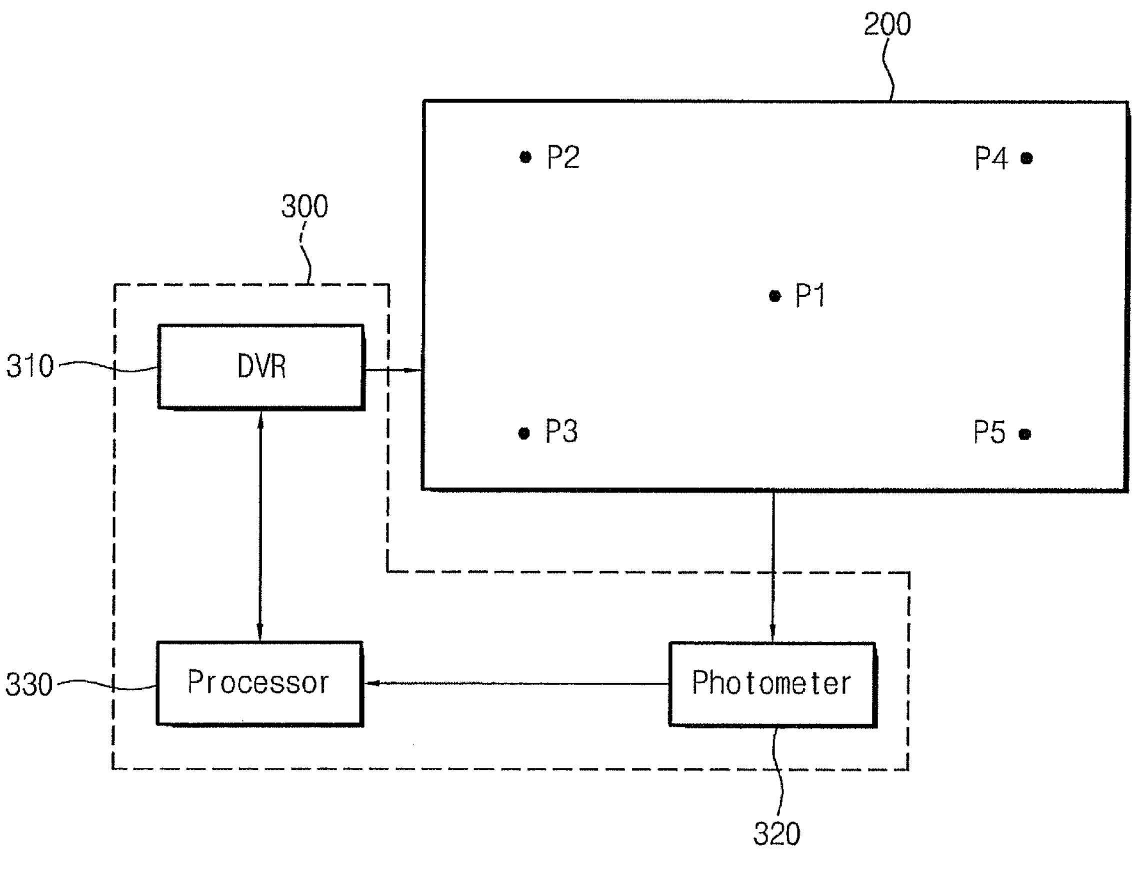
FIG. 8 is a block diagram illustrating an exemplary embodiment of an optimized DVR value tester of a display panel in accordance with the present invention.
Figure 9:
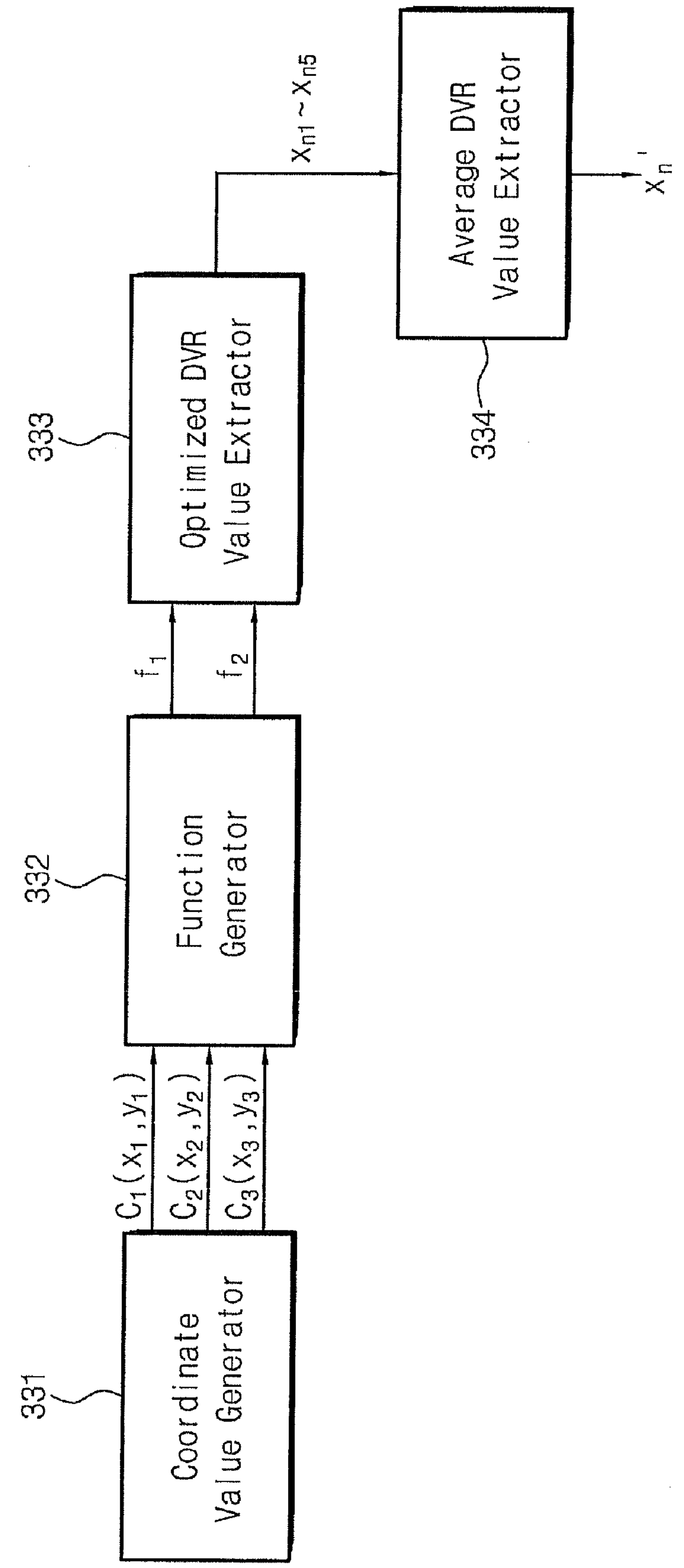
FIG. 9 is a block diagram of the exemplary embodiment of a processor shown in FIG. 8.

FIG. 8 is a block diagram illustrating an exemplary embodiment of an optimized DVR value tester of a display panel in accordance with the present invention, and FIG. 9 is a block diagram of the exemplary embodiment of a processor of FIG. 8.

Referring to FIG. 8, the exemplary embodiment of an optimized DVR value tester 300 includes a DVR 310, a photometer 320, and a processor 330. The DVR 310 varies a DVR value corresponding to a voltage level of common voltage, and then applies the varied DVR value to a display panel 200. The display panel 200 then uses the varied DVR value and the common voltage to display an image. The display panel 200 changes in brightness according to the varied DVR value. The photometer 320 measures brightness values at first, second, third, fourth and fifth points P1, P2, P3, P4 and P5 for at least two frames. Alternative exemplary embodiments of optimized DVR value testers may measure brightness values at a different number of points and the points may be positioned at various locations of the display panel 200.

The brightness values at the first to fifth points P1 to P5 are output from the photometer 320 and provided to the processor 330. The processor 330 extracts flicker values corresponding to each DVR value using the brightness values. Here, the flicker values are calculated by dividing AC components of the brightness values by a DC component. Thereafter, optimized DVR values representing the minimum flicker value at the first to fifth points P1 to P5 are extracted through a method of extracting the optimized DVR value, one exemplary embodiment of which was described above with respect to FIGS. 1-3, and then an average of the extracted optimized DVR values is calculated. Thereby, an average DVR value for the entire display 200 is extracted.

As illustrated in FIG. 9, the processor 330 includes a coordinate value generator 331, a function generator 332, an optimized DVR value extractor 333, and an average DVR value extractor 334.

The coordinate value generator 331 generates first, second and third coordinate values $C_1$, $C_2$ and $C_3$, which are composed of DVR values varied three times and the flicker values corresponding to the DVR values. More specifically as described above, the first coordinate value $C_1$ includes a first x-coordinate value $x_1$ corresponding to the DVR value, and a first y-coordinate value $y_1$ corresponding to the flicker value, the second coordinate value $C_2$ includes a second x-coordinate value $x_2$ corresponding to the DVR value, and a second y-coordinate value $y_2$ corresponding to the flicker value, and the third coordinate value $C_3$ includes a third x-coordinate value $X_3$ corresponding to the DVR value, and a third y-coordinate value $y_3$ corresponding to the flicker value. Here, the first, second and third x-coordinate value $x_1$, $x_2$ and $x_3$ sequentially increase in magnitude.

The function generator 332 compares the first y-coordinate value $y_1$ and the third y-coordinate value $y_3$ to obtain the first linear function $f_1$, and the second linear function f2 based on the first coordinate value $C_1$, the second coordinate value $C_2$ and the third coordinate value $C_3$.

The optimized DVR value extractor 333 extracts the x-coordinate value of an intersection point at which the first and second straight lines intersect using the first and second linear functions $f_1$ and $f_2$. This process is repeated with the first, second, third, fourth and fifth points P1, P2, P3, P4 and P5. Thus, first, second, third, fourth and fifth optimized DVR values $x_{n1}$, $x_{n2}$, $x_{n3}$, $x_{n4}$ and $x_{n5}$ are extracted at the first, second, third, fourth and fifth points P1, P2, P3, P4 and P5, respectively.

The average DVR value extractor 334 calculates an average of the extracted first to fifth optimized DVR values $x_{n1}$ to $x_{n5}$, thereby extracting an average DVR value $x_n'$. The flicker value at the first point P1 among the first to fifth point P1 to P5 exerts the greatest influence on the flicker values of the display panel as a whole. Hence, in one exemplary embodiment the average DVR value extractor 334 adds a weight to the first optimized DVR value $x_{n1}$, and then calculates an average of the extracted first to fifth optimized DVR values $x_{n1}$ to $x_{n5}$, thereby extracting the average DVR value $x_n'$.

According to the exemplary method and device of extracting the optimized DVR value of the display panel, the DVR value is varied three times, and the optimized DVR value is extracted using two linear functions.

Therefore, a time taken to extract the optimized DVR value is shortened, so that productivity of the display panel can be improved. Further, the display panel can be driven on the basis of the extracted optimized DVR value, so that image quality of the display panel can be improved.

Although the exemplary embodiments of the present invention have been described, it is understood that the present invention should not be limited to these exemplary embodiments but various changes and modifications can be made by those of ordinary skill in the art within the spirit and scope of the present invention as hereinafter claimed.

What is claimed is:

1. A method of extracting an optimized digital variable resistor value of a display panel, the method comprising:

varying a digital variable resistor value, which is obtained by digitalizing a voltage level of a common voltage, three times and applying the varied digital variable resistor values to the display panel;

measuring brightness values of a screen of the display panel;

extracting flicker values corresponding to the varied digital variable resistor values using the brightness values; and extracting an optimized digital variable resistor value representing a minimum flicker value of the flicker values, wherein the extracting of the optimized digital variable resistor value includes:

generating first, second and third coordinate values, in which the first, second and third coordinate values have x-coordinate values representing the varied digital variable resistor values, and y-coordinate values representing the flicker values;

calculating a first linear function corresponding to a first straight line connecting two coordinate values of the first to third coordinate values, and a second linear function corresponding to a second straight line based on the first linear function and the other coordinate value of the first to third coordinate values; and extracting an x-coordinate value at an intersection point, at which the first and second straight lines intersect with each other, as the optimized digital variable resistor value using the first and second linear functions.

2. The method of claim 1, wherein the first coordinate value includes a first x-coordinate value and a first y-coordinate value, the second coordinate value includes a second x-coordinate value and a second y-coordinate value, and the third coordinate value includes a third x-coordinate value and a third y-coordinate value; and the first to third x-coordinate values sequentially increase.

3. The method of claim 2, wherein the calculating of the first and second linear functions includes:

comparing the first y-coordinate value and the third y-coordinate value to determine whether the first y-coordinate value is smaller than the third y-coordinate value;

extracting the first linear function corresponding to the first straight line having a first slope and the second linear function corresponding to the second straight line having a second slope substantially opposite to the first slope on the basis of the second and third coordinate values, if the first y-coordinate value is smaller than the third y-coordinate value;

comparing the first y-coordinate value and the third y-coordinate value to determine whether the first y-coordinate value is greater than the third y-coordinate value, if the first y-coordinate value is not smaller than the third y-coordinate value; and extracting the first linear function corresponding to the first straight line having a third slope and the second linear function corresponding to the second straight line having a fourth slope substantially opposite to the third slope on the basis of the first and second coordinate values, if the first y-coordinate value is greater than the third y-coordinate value.

4. The method of claim 3, wherein, if the third y-coordinate value is equal to the first y-coordinate value, the optimized digital variable resistor value is equal to the second x-coordinate value.

5. The method of claim 2, wherein the first to third x-coordinate values are within a range from about 0 to about 127.

6. The method of claim 5, wherein the first x-coordinate value is within a range from about 4 to about 63, the third x-coordinate value is within a range from about 65 to about 124, and the second x-coordinate value is 64.

7. The method of claim 1, wherein the extracting of the optimized digital variable resistor value includes extracting first to fifth optimized digital variable resistor values corresponding to five points on the display panel, wherein a first point is located at a center of the screen, a second point is located at a left upper portion with respect to the center, a third point is located at a left lower portion with respect to the center, a fourth point is located at a right upper portion with respect to the center, and a fifth point is located at a right lower portion with respect to the center.

8. The method of claim 7, further comprising calculating an average of the first to fifth optimized digital variable resistor values to extract an average digital variable resistor value.

9. The method of claim 8, wherein the calculating of the average of the first to fifth optimized digital variable resistor values to extract the average digital variable resistor value includes weighting the first optimized digital variable resistor value at the first point.

10. The method of claim 1, wherein the flicker values are defined by dividing alternating current components of the brightness values, which are measured at each point for at least two frames, by a direct current component, in which the direct current component is defined as an average value of the alternating current components.

11. The method of claim 1, wherein the brightness values of the screen of the display panel are measured for at least two frames.

12. A system for extracting an optimized digital variable resistor value of a display panel, the device comprising:

a digital variable resistor which varies a digital variable resistor value, which is obtained by digitalizing a voltage level of a common voltage, three times and which applies the varied digital variable resistor values to the display panel;

a photometer measuring brightness values of a screen of the display panel; and a processor which extracts flicker values corresponding to the varied digital variable resistor values using the brightness values output from the photometer, and which extracts an optimized digital variable resistor value corresponding to a minimum flicker value, wherein the processor includes:

a coordinate value generator which generates first, second and third coordinate values, in which the first, second and third coordinate values have x-coordinate values representing the varied digital variable resistor values, and y-coordinate values representing the flicker values;

a function generator calculating a first linear function corresponding to a first straight line connecting two coordinate values of the first to third coordinate values, and a second linear function corresponding to a second straight line based on the first linear function and the other one coordinate value of the first to third coordinate values; and an optimized digital variable resistor value extractor extracting an x-coordinate value at an intersection point, at which the first and second straight lines intersect, as the optimized digital variable resistor value using the first and second linear functions.

13. The system of claim 12, wherein the photometer measures the brightness values at a first point located at the center of the screen, a second point located at a left upper portion with respect to a center, a third point located at a left lower portion with respect to the center, a fourth point located at a right upper portion with respect to the center, and a fifth point located at a right lower portion with respect to the center.

14. The system of claim 13, wherein the processor further comprises an average digital variable resistor value extractor which calculates an average of first to fifth optimized digital variable resistor values which are extracted at the first to fifth points, respectively, to extract an average digital variable resistor value.

15. The system of claim 14, wherein the average digital variable resistor value extractor weights the first optimized digital variable resistor value corresponding to the first point, and then calculates the average of the first to fifth optimized digital variable resistor values to extract the average digital variable resistor value.

16. The system of claim 12, wherein the digital variable resistor has a size of about 27 bits, and the first to third x-coordinate values are within a range from about 0 to about 127.

17. The system of claim 12, wherein the photometer measures the brightness values of the screen of the display panel for at least two frames.

* * * * *